United States Patent [19]
Lehmann

[11] Patent Number: 5,177,451
[45] Date of Patent: Jan. 5, 1993

[54] UNITY GAIN AMPLIFIER WITH HIGH SLEW RATE AND HIGH BANDWIDTH

[75] Inventor: Klaus Lehmann, Muehltal, Fed. Rep. of Germany

[73] Assignee: Burr-Brown Corporation, Tucson, Ariz.

[21] Appl. No.: 736,727

[22] Filed: Jul. 26, 1991

[51] Int. Cl.$^5$ .............................................. H03F 3/30
[52] U.S. Cl. ..................................... 330/267; 330/263
[58] Field of Search ................ 330/263, 265, 267, 288

[56] References Cited

U.S. PATENT DOCUMENTS

| | | | |
|---|---|---|---|
| 3,914,703 | 10/1975 | Stauffer | 330/17 |
| 4,394,625 | 7/1983 | Sakai | 330/267 |
| 4,433,305 | 2/1984 | Ozawa et al. | 330/296 |
| 4,502,020 | 2/1985 | Nelson et al. | 330/268 |
| 4,540,951 | 9/1985 | Ozawa et al. | 330/267 |
| 4,595,883 | 6/1986 | Nakayama | 330/255 |
| 4,628,279 | 12/1986 | Nelson | 330/257 |
| 4,629,998 | 12/1986 | Fujiwara | 330/304 |
| 4,639,685 | 1/1987 | Saller et al. | 330/263 |
| 4,780,689 | 10/1988 | Saller et al. | 330/267 |
| 4,791,383 | 12/1988 | Monticelli et al. | 330/265 |
| 4,833,424 | 5/1989 | Wright | 330/267 |
| 5,049,653 | 9/1991 | Smith et al. | 330/263 X |

FOREIGN PATENT DOCUMENTS 4106  1/1989  Japan ................................ 330/252

OTHER PUBLICATIONS

*Wireless World*, Sep. 1976.
"Offset-Compensated Emitter-Follower", *IEEE Journal of Solid-State Circuits*, Jun. 1971, pp. 127-128.

Primary Examiner—James B. Mullins
Attorney, Agent, or Firm—Cahill, Sutton & Thomas

[57] ABSTRACT

A unity gain amplifier of the diamond follower type provides the combination of negligible input offset voltage, high slew rate, and high bandwidth by providing first and second opposite polarity current mirror circuits which respond to currents flowing through first and second input transistors to boost current available to charge parasitic capacitances during fast rise times and fast fall times of an input pulse. The rapid charging and discharging of the parasitic capacitances eliminates degradation in the rise and fall times of an output pulse produced by the unity gain amplifier. The gains of the first and second current mirror circuits have values that result in critically damped high frequency response of the unity gain amplifier in response to high speed transistions of the input signal. Darlington output stages are used to avoid frequency response peaking due to current gain rolloff of the output transistors at high currents and high frequencies. The unity gain amplifier is used in high performance operational transconductance amplifier.

16 Claims, 4 Drawing Sheets

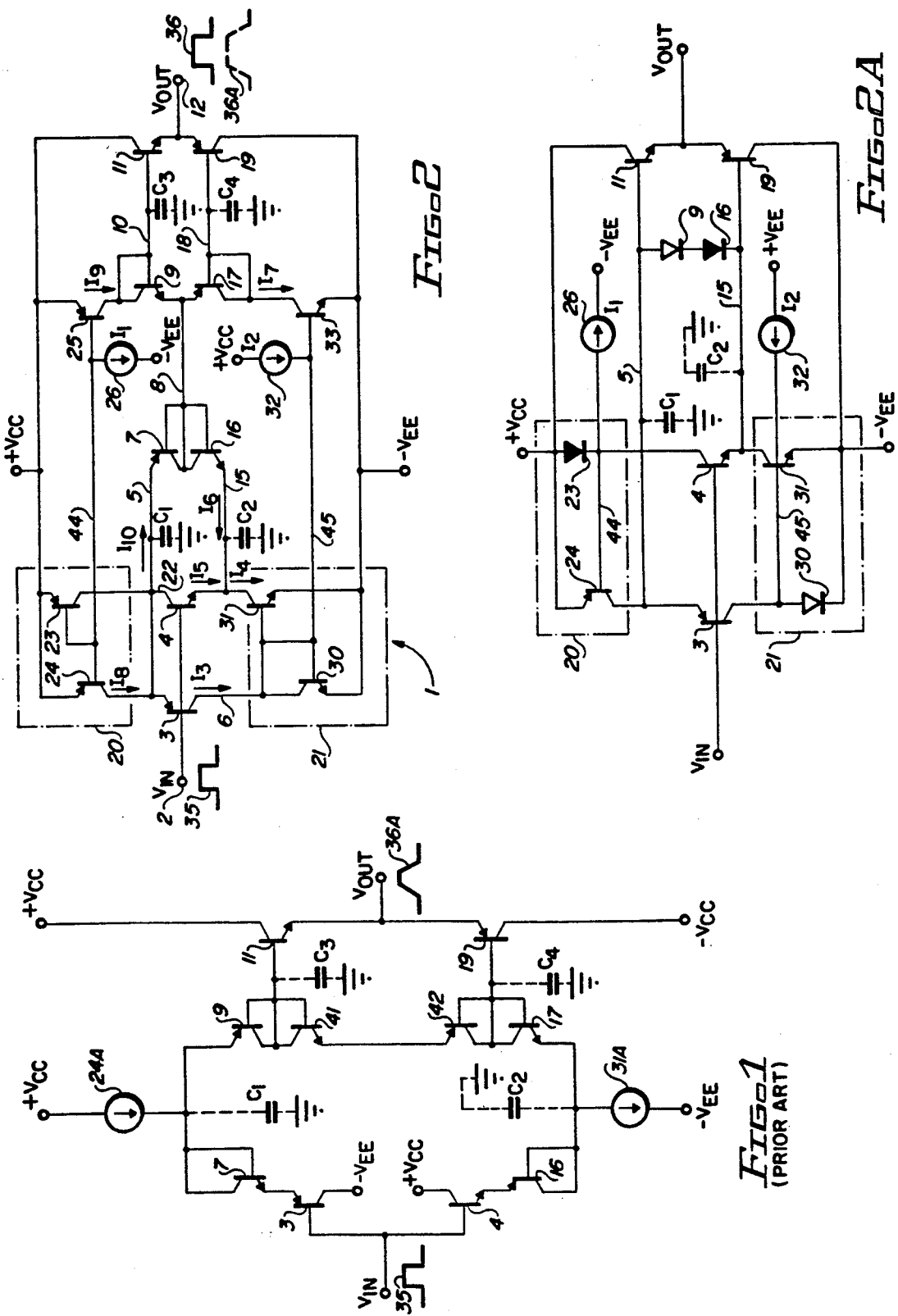

UNITY GAIN AMPLIFIER WITH HIGH SLEW RATE AND HIGH BANDWIDTH

CROSS REFERENCE TO RELATED APPLICATION

This application is a continuation in part of commonly assigned allowed pending patent application "UNITY GAIN AMPLIFIER WITH HIGH SLEW RATE AND HIGH BANDWIDTH", by the present inventor, filed on Mar. 29, 1991, Ser. No. 677,169, now abandoned.

BACKGROUND OF THE INVENTION

The invention relates to unity gain amplifiers of the type commonly referred to as diamond followers, and more particularly to improvements that provide the combination of improved input offset voltage, high slew rate, and high bandwidth.

U.S. Pat. No. 4,639,685 (Saller et al.) issued Jan. 27, 1987 discloses improvements in a standard diamond follower circuit to overcome the input offset problem of the basic diamond follower circuit, which is shown in FIG. 1 of the Saller et al. patent.

FIG. 1 of the present patent application shows the circuit in FIG. 4 of the Saller et al. reference. Saller et al.'s contribution in developing that circuit is the recognition that the input offset voltage $V_{IN}-V_{OUT}$ can be made equal to zero by providing two upward level shifts equal to the $V_{BE}$ voltages of a PNP diode-connected transistor and an NPN diode-connected transistor and also providing two downward level shifts equal to the $V_{BE}$ voltages of a PNP diode-connected transistor and an NPN diode-connected transistor in each of the two signal paths from $V_{IN}$ to $V_{OUT}$. In FIG. 1, the offset voltage is equal to the $V_{BE}$ voltage of PNP input transistor 3 plus the $V_{BE}$ voltage of NPN transistor 7 minus the $V_{BE}$ voltage of PNP transistor 9 minus the $V_{BE}$ voltage of NPN output transistor 11. This offset voltage is equal to zero because the $V_{BE}$ voltages of PNP transistors 3 and 9 are equal and the $V_{BE}$ voltages of NPN transistors 7 and 11 are equal, assuming that the transistor geometries and current densities are properly matched. The offset voltage in the circuit of FIG. 1 also is equal to the sum of the $V_{BE}$ voltages of NPN transistor 4 and PNP transistor 16 minus the sum of the $V_{BE}$ voltages of NPN transistor 17 and PNP transistor 19.

A major problem with the input-offset-compensated circuit of FIG. 1 is that its slew rate is very poor because when the input transistor 3 is switched off by a fast rising transition of $V_{IN}$, the constant current source 24A must charge up substantial parasitic capacitances C1 and C3, causing considerable delay in the response of $V_{OUT}$. Similarly, if input transistor 4 is switched off by a rapidly falling transition of $V_{IN}$, constant current source 31A must discharge substantial parasitic capacitances C2 and C4, resulting in considerable delay of the corresponding negative going downward transition of $V_{OUT}$. The sloped leading and trailing edges of $V_{OUT}$ curve 36A in FIG. 1 indicates a poor slew rate that the circuit would have in response to a $V_{IN}$ pulse 35 applied to input conductor 2 (in contrast to the steep slopes of the leading and trailing edges of waveform 36 in FIG. 2, which indicates high slew rate and high bandwidth achieved by the improvement of the present invention).

U.S. Pat. No. 4,833,424 by Wright discloses a unity gain linear amplifier circuit in which current mirror circuitry boosts current to nodes of circuitry which drives complementary output transistors. That circuitry is more complex than desirable, and provides considerably less "voltage head room" (i.e., room for output voltage swings) on the bases of the output transistors than is desirable.

There is a substantial unmet need for an input-offset-compensated diamond follower unity gain amplifier circuit having a high slew rate and wide bandwidth.

SUMMARY OF THE INVENTION

Accordingly, it is an object of the invention to provide an improved diamond follower type of unity gain amplifier which has a high slew rate and wide bandwidth.

It is another object of the invention to provide an improved unity gain amplifier circuit that is input-offset-compensated and has high slew rate and wide bandwidth.

Briefly described, and in accordance with one embodiment thereof, the invention provides a diamond follower type of unity gain buffer which is input-offset-compensated and provides a high slew rate by utilizing first and second current mirror circuits receiving as a control current input the collector current of one of the input transistors and supplying a controlled current to supply it to charge up parasitic capacitances and the signal paths to the output transistors of the diamond follower circuit. In the described embodiments, the unity gain amplifier includes a unity gain amplifier having a PNP input transistor, an NPN input transistor, a PNP output transistor, and an NPN output transistor, each having an emitter, a base, and a collector. The bases of the PNP input transistor and an NPN input transistor receive an input signal. The NPN output transistor and PNP output transistor are coupled to an output conductor to produce an output signal. In an embodiment which essentially eliminates input offset voltage, a first PNP transistor and a first NPN transistor are coupled between the PNP input transistor and the NPN output transistor to produce a PNP $V_{BE}$ voltage drop and an NPN $V_{BE}$ voltage rise to offset a PNP $V_{BE}$ voltage rise of the PNP input transistor and an NPN $V_{BE}$ voltage drop of the NPN output transistor, respectively. A second PNP transistor and a second NPN transistor are coupled between the NPN input transistor and the PNP output transistor to produce a PNP $V_{BE}$ voltage drop and an NPN $V_{BE}$ voltage rise to offset a PNP $V_{BE}$ voltage rise of the PNP output transistor and an NPN $V_{BE}$ voltage drop of the NPN input transistor, respectively. In each of the embodiments, a first current mirror circuit includes a first current output transistor and control transistor coupled to the collector of the NPN input transistor to supply increased current to charge parasitic capacitance in a first signal path including emitter-base junctions of the PNP input transistor and the NPN output transistor in response to a positive-going transition of the input signal. In the input offset compensated embodiments, the first signal path also includes the first NPN transistor and the first PNP transistor. A second current mirror circuit includes a second current output transistor and a second control transistor coupled to the collector of the PNP input transistor to supply increased current to discharge parasitic capacitance in a second signal path including emitter-base junctions of the NPN input transistor and the PNP output transistor. In the input offset compensated embodiments, the second signal path includes the second PNP transistor and the second NPN transistor. A first bias current source is coupled to the collector and base of the first control transistor to provide a bias current thereto in order to minimize coupling cross-talk from the input signal to other external circuits. A second bias current source is similarly coupled to the second control transistor. The gains of the first and second current mirror circuits have values that result in critically damped high frequency response of the unity gain amplifier in response to high speed transitions of the input signal. In one embodiment, the output stages are Darlington stages, to prevent high output load current from robbing the boost currents provided by the first and second current mirror circuits. Otherwise, such high output load currents result in large base currents that divert the output currents of current mirrors 20 and 21 from charging up the parasitic capacitances, thereby degrading large magnitude, fast transition pulse response of the unity gain buffer. In another embodiment, an open loop operational transconductance amplifier (OTA) is formed by using a pair of opposite polarity current mirror circuits to translate collector currents in the NPN and PNP output transistors to an output conductor which is connected to outputs of the opposite polarity current mirror circuits. This embodiment produces a scaled output current of the unity gain buffer circuit through an output conductor with a very high output impedance.

BRIEF DESCRIPTION OF THE DRAWINGS

FIG. 1 is a schematic diagram of a prior art offset-compensated diamond follower circuit.

FIG. 2 is a schematic diagram of an offset-compensated diamond follower circuit of the present invention with current mirror feedback to improve slew rate and bandwidth.

FIG. 2A is a schematic diagram of a non-compensated diamond follower circuit of the present invention with current mirror feedback to improve slew rate and bandwidth.

DETAILED DESCRIPTION OF THE PREFERRED EMBODIMENTS

Figure 3:
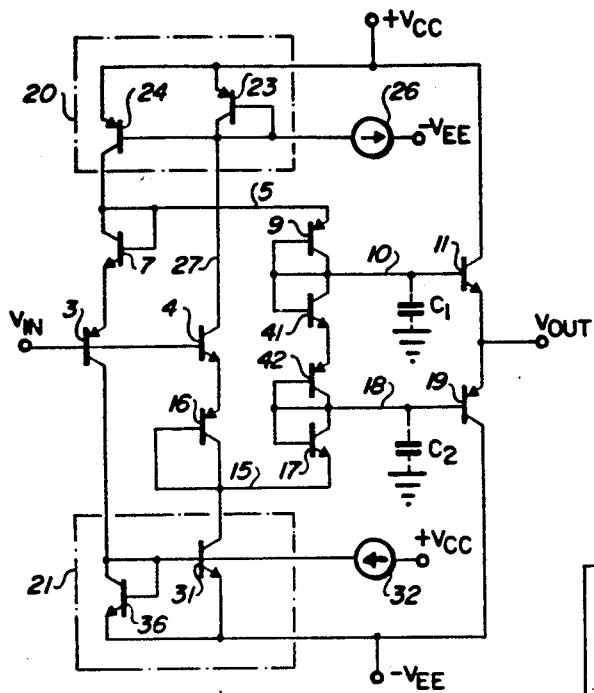
FIG. 3 is a schematic circuit diagram of another offset-compensated diamond follower circuit of the invention.

Referring to FIG. 2, modified diamond follower circuit 1 includes an input terminal 2 to which an input voltage $V_{IN}$ is applied. $V_{IN}$ can be a pulse waveform 35 having very fast rise times and fall times, of approximately one nanosecond. $V_{IN}$ is applied to the bases of PNP transistor 3 and NPN transistor 4 by conductor 2. The emitter of transistor 3 is connected by conductor 5 to the collector of PNP current mirror output transistor 24 and to the emitter of PNP transistor 7. The collector of transistor 3 is connected by conductor 6 to the base and collector of NPN current mirror control transistor 30, the base of current mirror output transistor 31, and the base of NPN transistor 33. The emitters of transistors 30, 31, and 33 are connected to $-V_{EE}$. The collector of transistor 31 is connected by conductor 15 to the emitter of input transistor 4 and to the emitter of diode-connected NPN transistor 16.

The collector of input transistor 4 is connected by conductor 22 to the base and collector of PNP current mirror control transistor 23, the base of transistor 24, and to the base of PNP current mirror output transistor 25. The emitters of transistors 23, 24, and 25 are connected to $+V_{CC}$. A current source 26 producing a constant current $I_1$ is connected between $-V_{EE}$ and conductor 44. A current source 32 producing a constant current $I_2$ is connected between $+V_{CC}$ and conductor 45.

The collector of current mirror output transistor 25 is connected by conductor 10 to the base and collector of NPN transistor 9 and the base of output NPN transistor 11. The emitter of transistor 9 is connected by conductor 8 to the base and collector of transistor 16 and to the emitter of PNP transistor 17. The base and collector of PNP transistor 17 are connected by conductor 18 to the collector of current mirror output transistor 33 and the base of PNP output transistor 19. The collector of output transistor 11 is connected to $+V_{CC}$ and the collector of output transistor 19 is connected to $-V_{EE}$.

A current $I_3$ flows through the collectors of transistors 3 and 30, assuming negligible base currents. $I_4$ flows through the collector of transistor 31. $I_5$ flows through the collectors of transistors 4 and 23, assuming negligible base currents. $I_6$ flows through transistor 16. $I_7$ flows through the collectors of transistors 17 and 33. $I_8$ flows through the collector of transistor 24. $I_9$ flows through the collectors of transistors 25 and 9. $I_{10}$ flows through transistor 7.

It initially was believed that the best "tuning" for the circuit of FIG. 2 occurs when the geometries of all corresponding transistors are matched or scaled so that $V_{BE}$s of like transistors are matched for identical collector currents. For example, the quiescent current values could be given by the following table.

| $I_1$ | $I_2$ | $I_3$ | $I_4$ | $I_5$ | $I_6$ | $I_7$ | $I_8$ | $I_9$ | $I_{10}$ |
|---|---|---|---|---|---|---|---|---|---|
| 1ma | 1ma | 1ma | 2ma | 1ma | 1ma | 1ma | 2ma | 1ma | 1ma |

If a fast $V_{IN}$ pulse 35 then is applied to the bases of input transistors 3 and 4, this will tend to turn transistor 3 off and to turn transistor 4 on harder. The portion of $I_8$ flowing into the emitter of transistor 3 decreases to zero, and all of the approximately 20 milliamperes of $I_8$ flows through conductor 5 to charge up parasitic capacitor C1 and into the emitter of transistor 7.

Meanwhile, $I_3$ decreases to nearly zero, causing the current $I_4$ of current mirror 21 to also fall to nearly zero, and also causing $I_7$ to fall to nearly zero.

Transistor 4, which is being turned on harder, causes $I_5$ to sharply increase since $I_4$ has fallen to zero, and the increased $I_5$ flows through conductor 15, charging up parasitic capacitor C2 and causing $I_6$ to decrease.

The voltage on conductor 8 therefore rises very rapidly. The increased currents $I_8$ and $I_9$ produced by transistors 24 and 25 in response to the increased current produced in current mirror control transistor 23 (due to the increased value of $I_5$) increase the speed of charging parasitic capacitors C1 and C3, respectively. The decreased value of $I_7$, in conjunction with the increased values of $I_8$ and $I_{10}$, causes rapid charging of parasitic capacitor C4, thereby aiding the rapid rise of the voltage on conductor 18. Consequently, a very fast rise time is produced in the $V_{OUT}$ voltage waveform 36 on conductor 12.

Similarly, when the falling edge of $V_{IN}$ pulse 35 occurs, it tends to turn off NPN transistor 4 and turn PNP transistor 3 on harder. The result is an increase in $I_3$ flowing in current mirror control transistor 30, and consequently increases in current mirror output transistors $I_4$ and $I_7$, accompanied by a reduction of both $I_5$ and the current flowing in current mirror control transistor 23, resulting in reductions in $I_8$ and $I_9$. The increased current $I_4$ is almost entirely available to discharge parasitic capacitor C2. The increased value of $I_7$ rapidly discharges parasitic capacitor C4. $I_{10}$ is decreased. $I_6$ is increased, increasing the current through transistors 9 and 16, discharging parasitic capacitor C3. The increased values of $I_6$ and $I_7$ increase the currents flowing through transistor 7, helping to rapidly discharge parasitic capacitors C1 and C3. Consequently, the voltages on conductors 10 and 18 fall rapidly, and the trailing edge of the $V_{OUT}$ waveform on conductor 10 fall sharply.

The circuit of FIG. 2 thus provides the combination of advantages including high bandwidth and slew rate and accurate input offset voltage compensation. The accurate offset voltage compensation occurs because the signal path from $V_{IN}$ to $V_{OUT}$ through the emitter base junctions of transistors 3, 7, 9, and 11 includes both an upward and a downward PNP $V_{BE}$ shift, resulting in a net offset of zero and an upward and a downward NPN $V_{BE}$ shift. Similarly, the signal path from $V_{IN}$ to $V_{OUT}$ through the emitter base junctions of transistors 4, 16, 17, and 19 includes a downward NPN $V_{BE}$ shift through transistor 4 and a matching shift through transistor 17 which is precisely offset by an upward PNP $V_{BE}$ shift through transistor 19, resulting in a net offset of zero. The current mirrors 20 and 21 respond to currents in the collectors of the input transistors 3 and 4 to supply increased charging currents for the parasitic capacitances and thereby improve bandwidth and slew rate of the diamond follower circuit.

It has been found that if the transistor geometries are matched as indicated above, there is inaccurate reproduction of high speed digital input pulses having very short rise times and fall times of the order of one nanosecond.

Figure 6:
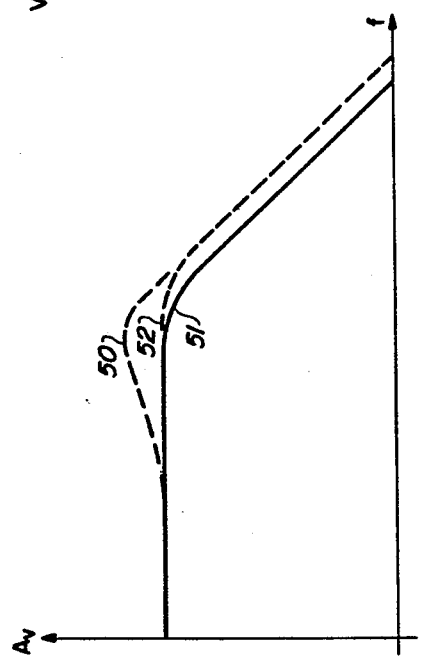
FIG. 6 is a diagram useful in explaining the operation of the circuit of the present invention.

This phenomena is thought to be due to "peaking" of the frequency response of the modified diamond follower circuit at high values of the currents produced through the emitters of the various above indicated transistors in response to the leading edge and falling edge of an input pulse such as 35 in FIG. 2. In FIG. 6, numeral 50 designates the peaking referred to in the gain versus frequency characteristic of the modified diamond follower circuit.

It is thought that one cause, perhaps the major cause of such frequency response peaking at high frequencies is the reduction of the internal emitter resistance $r_e$, which is known to be inversely proportional to emitter current. The above described increased emitter currents caused by the response of current mirrors 20 and 21 to fast rising and fast falling edges of an input pulse such as 35 decrease the emitter resistances, and this increases the frequency response at approximately the 3 db point of the frequency response plot of FIG. 6.

Figure 4:
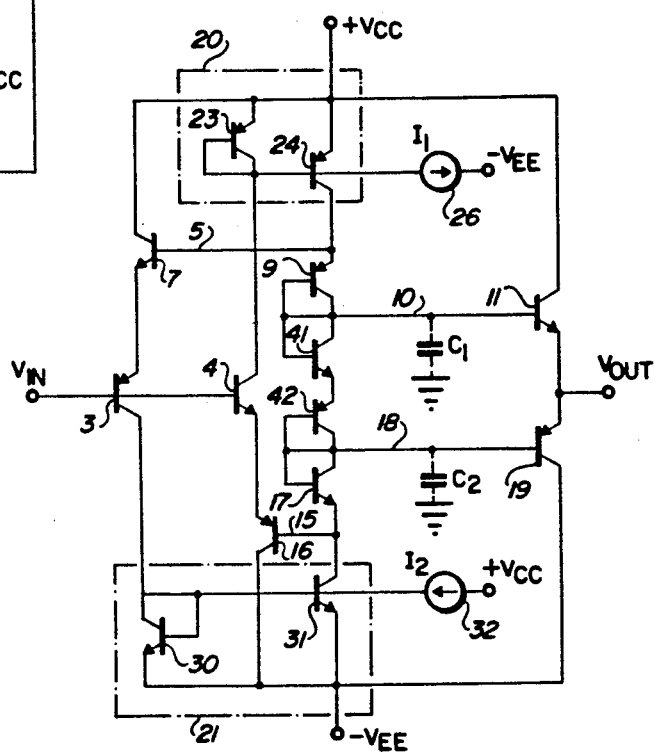
FIG. 4 is a schematic diagram of another offset-compensated, high slew rate amplifier of the present invention.

Another possible reason for the peaking 50 in the frequency response of the circuit of FIG. 4 (and also the other embodiments of the invention described herein) is that the transistors may have the property that their frequency response increases with current up to a certain point, so the observed peaking 50 of the frequency response may be the combination of that effect with the reduction of $r_e$ described above.

Initial attempts at eliminating the peaking 50 were made by adding resistances in series with the bases of input transistors 3 and 4. The addition of such resistances did indeed have the effect of "damping" the frequency response, but also had an undesirable effect of lowering the overall high frequency response of the circuit. This would cause inaccuracy in the reproduction of high speed digital pulses.

In accordance with the present invention, it was eventually discovered for the circuits of the invention disclosed herein that by reducing the "gain" of current mirrors 20 and 21 from the unity gain values indicated above to lower values in the range from 0.70 to 1.00, a reduction in the peaked frequency response from the curve 50 to that indicated by curve 52 in FIG. 6 was achieved without reducing the overall high frequency response. Curve 52 has the appearance of a critically damped frequency response, which is what is needed to prevent oscillation or "ringing" of the circuit without reducing overall high frequency response. (In FIG. 6, Numeral 51 indicates the small signal frequency response of the circuit originally described, with matched emitter geometries to produce the currents indicated that the quiescent currents indicated in the above table.) It should be appreciated that damping more than or slightly less than critical damping will also prevent oscillation or ringing.

Although the above range of 0.70 to 1.00 for the gains of current mirrors 20 and 21 was found to be ideal for the circuits disclosed herein, it is believed that the ranges of ideal gains may be different for other embodiments of the invention. It was eventually discovered that for high amplitude (e.g., 6 volts peak-to-peak) input pulses of $V_{IN}$ with fast transitions (e.g., rise and fall times of less than 0.5 nanoseconds), and high output current pulses through transistors 11 and 19, the pulse response of the previously described unity gain circuits is degraded. Although the above-described non-unity current gains of current mirrors 20 and 21 solve the problem of peaking in the frequency response curve shown in FIG. 6 for fast transition, low magnitude output current pulses, it does not solve the problem for fast transition high magnitude output current pulses.

Figure 7:
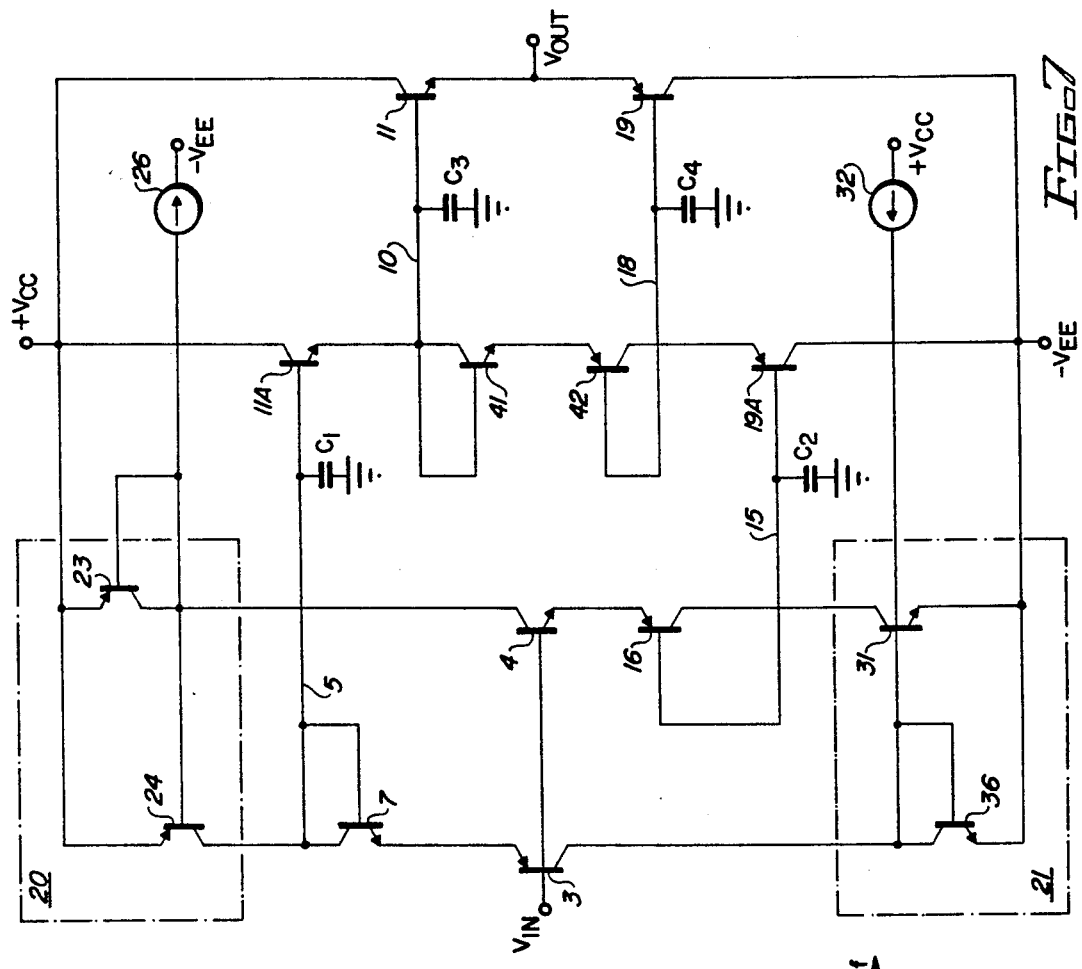
FIG. 7 is a schematic diagram of a diamond follower circuit of the invention having a Darlington output stage.

In accordance with another aspect of the present invention, providing the Darlington output stages shown in FIG. 7 results in optimum overall performance for both small magnitude input signals and high magnitude input signals with fast rise and fall times. In FIG. 7, the Darlington pullup stage includes NPN transistor 11A, which has its base connected to conductor 5, its collector connected to $+V_{CC}$, and its emitter connected to conductor 10. Transistor 11 is the output transistor of the Darlington pullup stage. The Darlington pulldown stage includes PNP transistor 19A, which has its base connected to conductor 15, its collector connected to $-V_{EE}$, and its emitter connected to conductor 18. Transistor 19 is the output transistor of the Darlington pulldown stage.

In FIG. 7, transistors 11 and 19 are 40× devices, meaning that they have an emitter area of 40 times that of a "minimum size" transistor for the manufacturing process being used. Transistors 11A and 19A are 6× devices, and transistors 41 and 42 are 4× devices. (Note that diode-connected transistors 41 and 42 could be connected in several different configurations that would provide the needed bias of transistors 11 and 19. For example, the collectors of transistors 41 and 42 could be connected to each other, and the emitter of PNP transistor 42 could be connected to conductor 10 and the emitter of NPN transistor 41 could be connected to conductor 18.)

High frequency components of high amplitude output current pulses in transistors 11 and 19 produce substantial degradation of the current gain $\beta$ of transistors 11 and 19. Such reductions in $\beta$ increase the amount of base current needed by transistors 11 and 19, reducing the amount available from current mirrors 20 and 21 to charge parasitic capacitances such as $C_1$ and $C_2$. This decreases the frequency response of the buffer amplifier circuit and decreases the accuracy with which high speed and/or high magnitude input pulses are reproduced at $V_{OUT}$.

It has been found that provision of Darlington driver transistors 11A and 19A in FIG. 7 isolates current mirrors 20 and 21 from the high base current requirements of output transistors 11 and 19 for a heavy output current load, such as that presented by a 50 ohm output line connected to the $V_{OUT}$ conductor. The amount of base current required for Darlington driver transistors 11A and 19A is greatly reduced compared to that required by output transistors 11 and 19, allowing most of the boost current supplied by current mirrors 20 and 21 to charge and discharge parasitic capacitors $C_1$ and $C_2$.

This did not become known until considerable experimentation had been performed with the various circuits shown in FIGS. 2, 2A, 3, and 4, first for current mirrors 20 and 21 with unity gain and later with those current mirrors having less than unity gain. Still later experiments have shown that when Darlington driver transistors 11A and 19A are used, optimum circuit performance is achieved with current mirrors 20 and 21 having less than unity gain, but with the current mirror gains being slightly different than if the Darlington driver transistors 11A and 19A are not used.

Figure 8:
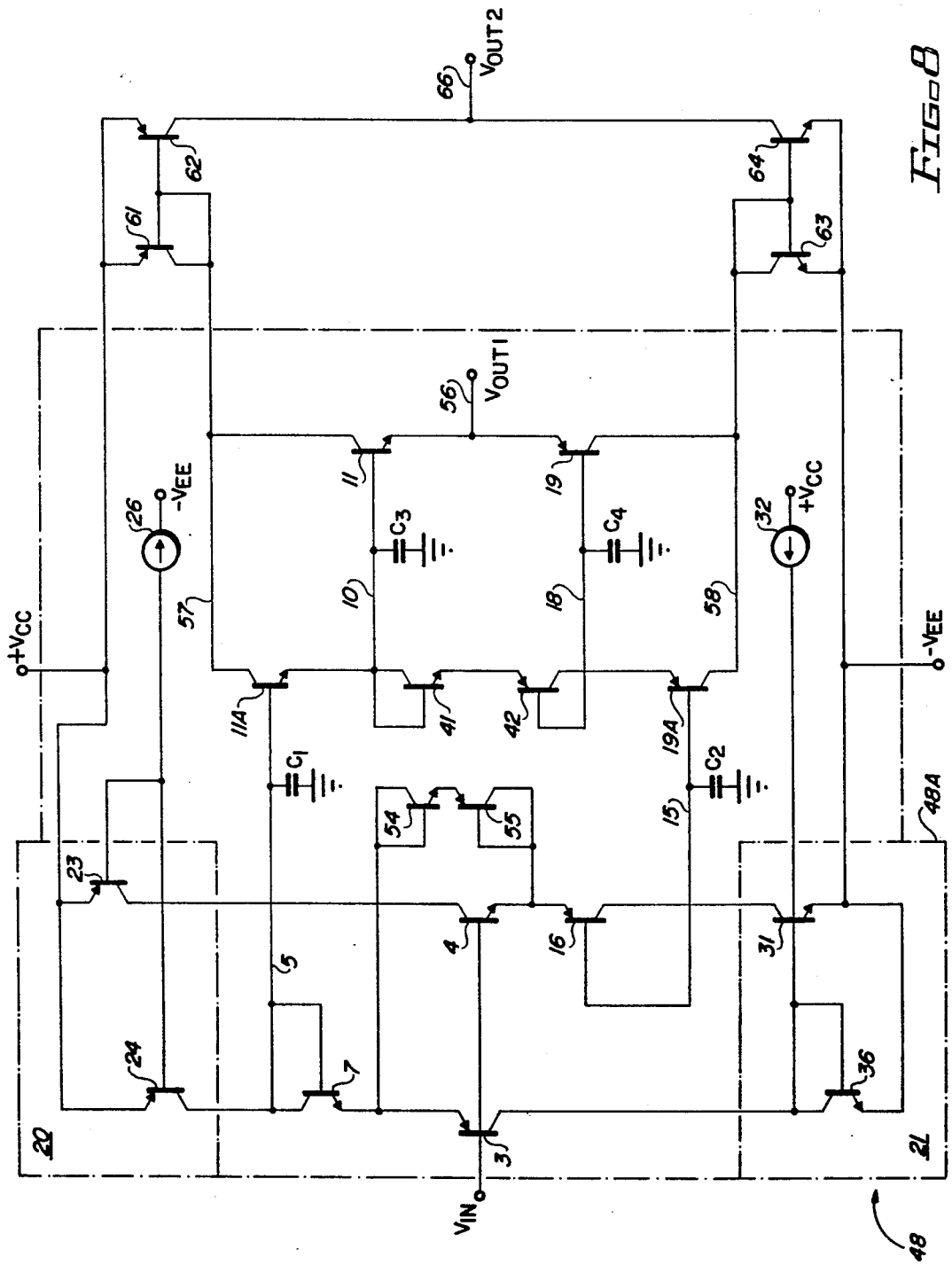
FIG. 8 is a schematic diagram of an open loop operational transconductance amplifier including the unity gain buffer circuit of the present invention with Darlington output stages and output current mirrors.

FIG. 8 shows an open loop operational transconductance amplifier (OTA) 48 including a diamond follower unity gain buffer 48A having Darlington driver NPN transistor 11A and Darlington driver PNP transistor 19A. In this case conductor 56 carries the signal $V_{OUT1}$, which is the $V_{OUT}$ signal of the previously described circuits. The collectors of transistors 11 and 11A are connected by conductor 57 to the collector and base of diode-connected PNP transistor 61, which is the control transistor of a PNP current mirror including output PNP transistor 62. The collectors of transistors 19 and 19A are connected by conductor 58 to the collector and base of diode-connected NPN transistor 63, which is the control transistor of an NPN current mirror including NPN output transistor 64. The gains of PNP output current mirror 61,62 and NPN output current mirror 63,64 are preferably in the range from 1 to 3. In FIG. 8, transistors 11A and 19A are 4× devices, diodes 41 and 42 are 4× devices, transistors 11 and 19 are 10× devices.

The base of transistor 62 is connected to the base and collector of transistor 61. The emitters of transistors 61 and 62 are connected to $V_{CC}$. The collector of transistor 62 is connected to $V_{OUT2}$ conductor 66. The base of transistor 64 is connected to the base and collector of transistor 63. The collector of current mirror output transistor 64 is connected to $V_{OUT2}$ conductor 66. The emitter of both transistors 63 and 64 are connected to $-V_{EE}$.

Operational transconductance amplifier 48 therefore achieves a very high output impedance by mirroring collector currents by transistors 11 and 19 through current mirrors 61,62, and 63,64 to the $V_{OUT}$ conductor.

In FIG. 8, diode-connected NPN transistor 54 and diode-connected PNP transistor 55 are scaled relative to transistors 3 and 4 so that only 100 microamperes of bias current flows through each of them, and the rest of the bias current established by current sources 26 and 32 flows through diodes 54 and 55. Thus, ample bias current is available from the current mirror output transistors 24 and 31 to rapidly charge and/or discharge the node capacitances $C_1$ and $C_2$.

FIG. 2A shows a modified diamond follower circuit including the current mirrors 20 and 21 of FIG. 2, but excluding the connection of transistors 7, 9, 16, and 17 as shown in the signal paths in FIG. 2. Instead, conductor 5 is connected to the base of transistor 11, conductor 15 s connected to the base of transistor 19, and transistors 7, 16, 25, and 33 are omitted. The operation of the current mirrors is identical to that described above with respect to FIG. 2, and the benefits of the high slew rate and high bandwidth are achieved. This circuit will be preferred for applications which do not require input offset voltage.

It should be appreciated that current sources 26 and 32 are normally implemented using current mirror output transistors which have a collector-to-base parasitic capacitance, and that only small amounts of the rising and falling edge transitions of $V_{IN}$ pulse 35 are coupled through such collector-to-base parasitic capacitance onto current mirror bias voltage conductors 44 and 45. As a result, very little cross-talk gets introduced onto the current sources 26 and 32 and their external biasing circuits in response to $V_{IN}$. This avoids amplification of such cross-talk by other current source output transistors that might also be biased by the same biasing circuits. (Nevertheless, the circuit of FIG. 2 would function properly if current source 26 were connected between $+V_{CC}$ and conductor 5 and current source 32 were connected between $-V_{EE}$ and conductor 15.) The above biasing technique with current sources 26 and 32 also has the advantage that it does not increase and contribute to imbalances in parasitic capacitances C1 and C2, and therefore helps avoid decreases and imbalances in the slew rates of the circuit of FIGS. 2, 2A, 3, and 4.

Figure 5:
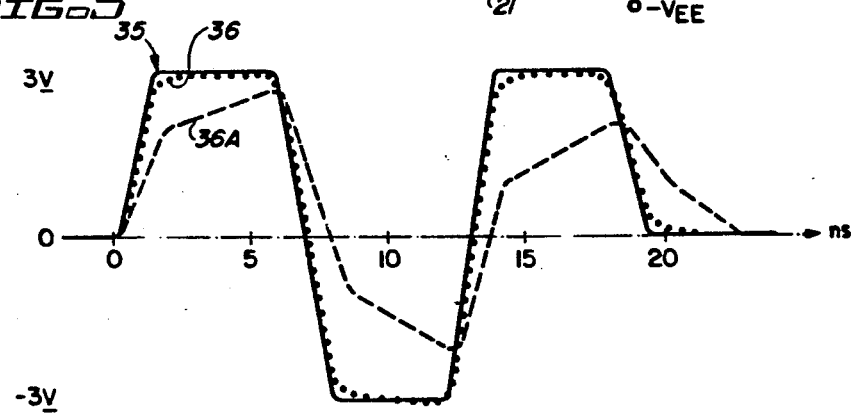
FIG. 5 is a diagram useful in explaining the advantages of the input-offset-compensated high slew rate diamond follower amplifiers of FIGS. 2-4.

The simulated performance of the circuit of FIG. 2 is shown in the waveform of FIG. 5, wherein it is obvious that both the fast rising and falling edges of the $V_{OUT}$ waveform 36 track very precisely with the rising and falling edges of $V_{IN}$ waveform 35.

FIG. 3 shows another embodiment of the invention which is quite similar to the prior art circuit of FIG. 1, except that the current sources 24A and 31A have been replaced by current mirror circuits 20 and 21, respectively. Alternatively, current sources 26 and 32 could be connected to conductors 5 and 15, respectively, but increased bias cross-talk coupling would result. In the circuit of FIG. 3, the current mirrors 20 and 21 work in cooperation with input transistors 3 and 4 in response to positive-going and negative-going transitions of $V_{IN}$ pulses in essentially the same manner as in FIG. 2, so that the amount of current available to charge parasitic capacitances C1 and C2 in response to a positive-going edge of $V_{IN}$ pulse 35 is greatly increased over that of the circuit of FIG. 1. The amount of current available to discharge the parasitic capacitors C1 and C2 in response to a negative-going edge of $V_{IN}$ pulse 35 also is greatly increased. The slew rate and bandwidth of the circuit of FIG. 3 therefore is greatly improved over that of FIG. 1, while achieving the same benefit of essentially zero input offset voltage.

Referring to FIG. 4, the modified diamond follower circuit is identical to that of FIG. 3, except that transistor 7 has its collector connected to $+V_{CC}$ instead of to the collector of current mirror output transistor 24 and has its base connected only to the collector of current mirror output transistor 24 and to the emitter of diode-connected transistor 9 by means of conductor 5. Transistor 16 has its collector connected to $-V_{EE}$ only, and has its base connected by conductor 15 only to the collector of current mirror output transistor 31 into the emitter of diode-connected transistor 17. This structural difference causes transistors 7 and 16 to function as high input impedance buffers with low output impedance at all practical frequencies. Therefore, transistors 7 and 16 respond very quickly to feedback through the string of diode-connected transistors 9, 41, 42, and 17 when input transistors 3 and 4 are rapidly turned on or off during rapid leading edge and trailing edge transitions of $V_{IN}$ input pulses.

In the circuit of FIG. 3, high frequency variations in the current supplied to the emitter of input transistor 3 are supplied by parasitic capacitance C1 (into which all of the parasitic capacitance associated with circuit nodes 5 and 10 have been "lumped" for convenience). Similarly, high frequency variations in the current supplied to the emitter of input transistor 4 are supplied by parasitic capacitance C2 (into which all of the parasitic capacitance associated with circuit nodes 15 and 18 have been "lumped"). This "charge controlled" structure tends to limit the slew rate and bandwidth of the circuit despite the above-described performance of current mirrors 20 and 21, and also causes the difference between slew rates for positive-going and negative-going signals to be a function of the imbalance in the parasitic capacitances C1 and C2, which is undesirable.

In contrast, the circuit of FIG. 4 provides a "voltage controlled" structure in which emitter follower transistor 7 supplies the high frequency variation in the emitter current of input transistor 3, and emitter follower transistor 16 supplies the high frequency variations in the emitter current of input transistor 4. This substantially improves the slew rate and bandwidth of the circuit of FIG. 4 over that of FIG. 3, and prevents imbalances in the parasitic capacitances C1 and C2 from producing imbalances in the slew rates for high frequency positive-going and negative-going signal changes.

Thus, the above-described embodiments of the invention provide the benefits of greatly increased slew rate and bandwidth over the closest prior diamond follower type unity gain amplifiers while providing the very low input offset voltage of the circuits disclosed in the Saller et al. patent.

While the invention has been described with reference to a particular embodiment thereof, those skilled in the art will be able to make the various modifications to the described embodiments of the invention without departing from the true spirit and scope of the invention.

What is claimed is:

1. A unity gain amplifier, comprising in combination:
  (a) a PNP input transistor, an NPN input transistor, a PNP output transistor, and an NPN output transistor, each having an emitter, a base, and a collector, the bases of the PNP input transistor and the NPN input transistor receiving an input signal, the NPN output transistor and the PNP output transistor being coupled to an output conductor to produce an output signal;
  (b) first means for coupling the emitter of the PNP input transistor to the base of the NPN output transistor;
  (c) second means for coupling the emitter of the NPN input transistor to the base of the PNP output transistor;
  (d) first current mirror means, including a first control transistor coupled to the collector of the NPN input transistor, for supplying increased current directly into a first parasitic capacitance associated with the first coupling means in response to a positive-going transition of the input signal, the first current mirror means having a current gain in the range of approximately 0.70 to 1.00;
  (e) second current mirror means, including a second control transistor coupled to the collector of the PNP input transistor, for sinking increased current directly from a second parasitic capacitance associated with the second coupling means in response to a negative-going transition of the input signal, the second current mirror means having a current gain in the range of approximately 0.70 to 1.00; and
  (f) first and second diodes coupled in series between the bases of the NPN output transistor and the PNP output transistor, current flowing from the first current mirror means also flowing through the first and second diodes to the second current mirror means and biasing both the NPN output transistor and the PNP output transistor to an ON condition, the gains of the first and second current mirror means having values that result in damped high frequency response of the unity gain amplifier in response to high speed transitions of the input signal.

2. The unity gain amplifier of claim 1 wherein the NPN output transistor is an output transistor of a first Darlington circuit and the PNP output transistor is an output transistor of a second Darlington circuit, the first means including an NPN Darlington driver transistor having a base coupled to the emitter of the PNP input transistor and having an emitter connected to the base of the NPN output transistor, and the second means including a PNP Darlington driver transistor having a base coupled to the emitter of the NPN input transistor and having an emitter connected to the base of the PNP output transistor.

3. The unity gain amplifier of claim 2 wherein the first control transistor is a PNP first current mirror control transistor having a base and collector connected to the collector of the NPN input transistor, and the first current mirror means includes a PNP first current mirror output transistor having an emitter and base connected to an emitter and the base of the first control transistor, respectively, and a collector coupled to the emitter of the PNP input transistor, and the second control transistor is an NPN second current mirror control transistor having a base and collector connected to the collector of the PNP input transistor, and the second current mirror means includes an NPN second current mirror output transistor having an emitter and base connected to an emitter and the base of the second current mirror control transistor, respectively, and a collector coupled to the emitter of the NPN input transistor.

4. The unity gain amplifier of claim 3 wherein the unity gain amplifier includes a first current source connected to the collector and base of the first control transistor to draw a first current out of the collector and base of the first control transistor, and a second current source connected to the collector and base of the second control transistor to supply a second current into the collector and base of the second control transistor.

5. The unity gain amplifier of claim 1 wherein the first means includes a first conductor connecting the emitter of the PNP input transistor to the base of the NPN output transistor, and the second means includes a second conductor connecting the emitter of the NPN input transistor to the base of the PNP output transistor.

6. A unity gain amplifier, comprising in combination:
 (a) a PNP input transistor, an NPN input transistor, a PNP output transistor, and an NPN output transistor, each having an emitter, a base, and a collector, the bases of the PNP input transistor and the NPN input transistor receiving an input signal, the NPN output transistor and the PNP output transistor being coupled to an output conductor to produce an output signal;
 (b) a first PNP transistor and a first NPN transistor coupled between the PNP input transistor and the NPN output transistor to produce a PNP $V_{BE}$ voltage drop and an NPN $V_{BE}$ voltage rise to offset a PNP $V_{BE}$ voltage rise of the PNP input transistor and an NPN $V_{BE}$ voltage drop of the NPN output transistor, respectively;
 (c) a second PNP transistor and a second NPN transistor coupled between the NPN input transistor and the PNP output transistor to produce a PNP $V_{BE}$ voltage drop and an NPN $V_{BE}$ voltage rise to offset a PNP $V_{BE}$ voltage rise of the PNP output transistor and an NPN $V_{BE}$ voltage drop of the NPN input transistor, respectively;
 (d) first current mirror means, including a first control transistor coupled to the collector of the NPN input transistor and a first current mirror output transistor for supplying increased current to charge a parasitic capacitance in a first signal path including emitter base junctions of the PNP input transistor, the first NPN transistor, the first PNP transistor, and the NPN output transistor in response to a positive-going transition of the input signal, the ratio of the emitter area of the first current mirror output transistor to the emitter area of the first control transistor being in the range of approximately 0.70 to 1.00; and
 (e) second current mirror means, including a second control transistor coupled to the collector of the PNP input transistor and a second current mirror output transistor, for supplying increased current to discharge a parasitic capacitance in a second signal path including emitter base junctions of the NPN input transistor, the second PNP transistor, the second NPN transistor, and the PNP output transistor in response to a negative-going transition of the input signal, the ratio of the emitter area of the second current mirror output transistor to the emitter area of the second control transistor being in the range of approximately 0.70 to 1.00, the gains of the first and second current mirror means having values that result in critically damped high frequency response of the unity gain amplifier in response to high speed transitions of the input signal.

7. The unity gain amplifier of claim 6 wherein an emitter of the first PNP transistor is connected to an emitter of the PNP input transistor, a collector and base of the first PNP transistor are connected to a collector and base of the second NPN transistor, and an emitter of the first NPN transistor is connected to an emitter of the second PNP transistor, a collector and base of the first NPN transistor are connected to the base of NPN output transistor, and a collector and base of the second PNP transistor are connected to the base of the PNP output transistor.

8. The unity gain amplifier of claim 7 wherein the collector and base of the first NPN transistor are connected to the first current mirror means, and the collector and base of the second PNP transistor are connected to the second current mirror means.

9. The unity gain amplifier of claim 6 wherein the first NPN transistor has an emitter coupled to the emitter of the PNP input transistor and a base connected to an emitter of the first PNP transistor, and a collector and base of the first PNP transistor are connected to a base of the NPN output transistor, and wherein an emitter of the second PNP transistor is connected to the emitter of the NPN input transistor, and wherein a base of the second PNP transistor is connected to an emitter of the second NPN transistor, a collector and base of the second NPN transistor being connected to a base of the PNP output transistor.

10. The unity gain amplifier of claim 9 wherein the collector and base of the first NPN transistor are connected to the first current mirror means, and wherein the collector and base of the second PNP transistor are connected to the second current mirror means, and wherein the collector and base of the first PNP transistor are connected to a collector and base of a third NPN transistor having an emitter connected to an emitter of a third PNP transistor having a collector and base connected to the collector and base of the second NPN transistor.

11. The unity gain amplifier of claim 9 wherein the collector of the first NPN transistor is connected to a first reference voltage conductor, and wherein the collector of the second PNP transistor is connected to a second reference voltage conductor, and wherein the collector and base of the first PNP transistor are connected to a collector and base of a third NPN transistor having an emitter connected to an emitter of a third PNP transistor having a collector and base connected to the collector and base of the second NPN transistor.

12. A method of improving slew rate and bandwidth of a unity gain amplifier including a PNP input transistor, an NPN input transistor, a PNP output transistor, and an NPN output transistor, first coupling means for coupling an emitter of the PNP input transistor to a base of the NPN output transistor, and second coupling means for coupling an emitter of the NPN input transistor to a base of the PNP output transistor, the method comprising the steps of:
 (a) applying a fast-rising transition of an input signal to bases of the PNP and NPN input transistors, reducing a $V_{BE}$ voltage of the PNP input transistor and reducing a collector current thereof, and simultaneously increasing a $V_{BE}$ voltage of the NPN input transistor and increasing a collector current thereof;

(b) causing the collector current of the NPN input transistor to flow through a control transistor in a first current mirror, thereby increasing an output current of the first current mirror, the first current mirror having a DC gain in the range of approximately 0.70 to 1.00;

(c) supplying the output current of the first current mirror to the first coupling means to rapidly charge a parasitic capacitance of the first coupling means, to thereby produce a fast-rising transition of an output signal in response to the fast-rising transition of the input signal;

(d) applying a fast-falling transition of the input signal to the bases of the PNP and NPN input transistors, thereby increasing a $V_{BE}$ voltage of the PNP input transistor and increasing a collector current thereof, and decreasing a $V_{BE}$ voltage of the NPN input transistor and decreasing a collector current thereof;

(e) causing the collector current of the PNP input transistor to flow through a control transistor of a second current mirror, thereby increasing an output current thereof, the second current mirror having a DC gain in the range of approximately 0.70 to 1.00;

(f) causing the output current of the second current mirror to discharge a parasitic capacitance associated with the second coupling means to thereby produce a fast-falling transition of the output signal in response to the fast-falling transition of the input signal;

(g) establishing a first bias current in the control transistor of the first current mirror by coupling a first constant current source to the control transistor of the first current mirror and causing the first bias current to flow in the first constant current source;

(h) establishing a second bias current to flow in the control transistor of the second current mirror by coupling a second constant current source to the control transistor of the second current mirror and causing the second bias current to flow in the second constant current source;

(i) operating an NPN Darlington driver transistor included in the first coupling means and coupled between the base of the NPN output transistor and the emitter of the PNP input transistor to reduce frequency response peaking of the unity gain amplifier caused by current gain rolloff of the NPN output transistor due to large output currents produced in response to high level, fast transition input signals; and (j) operating a PNP Darlington driver transistor included in the second coupling means and coupled between the base of the PNP output transistor and the emitter of the NPN input transistor to reduce frequency response peaking of the unity gain amplifier caused by current gain rolloff of the PNP output transistor due to large output currents produced in response to high level, fast transition input signals.

13. The method of claim 12 including coupling first and second diodes in series between the base of the NPN output transistor and the base of the PNP output transistor, current flowing from the first current mirror also flowing through the first and second diodes to the second current mirror and biasing both the NPN output transistor and the PNP output transistor to an on condition.

14. A method of improving slew rate and bandwidth of a unity gain amplifier including a PNP input transistor, an NPN input transistor, a PNP output transistor, and an NPN output transistor, first coupling means for coupling an emitter of the PNP input transistor to a base of the NPN output transistor, and second coupling means for coupling an emitter of the NPN input transistor to a base of the PNP output transistor, the method comprising the steps of:

(a) applying a fast-rising transition of an input signal to bases of the PNP and NPN input transistors, reducing a $V_{BE}$ voltage of the PNP input transistor and reducing a collector current thereof, and simultaneously increasing a $V_{BE}$ voltage of the NPN input transistor and increasing a collector current thereof;

(b) causing the collector current of the NPN input transistor to flow through a control transistor in a first current mirror, thereby increasing an output current of the first current mirror, the first current mirror having a DC gain in the range of approximately 0.70 to 1.00;

(c) supplying the output current of the first current mirror to the first coupling means to rapidly charge a parasitic capacitance of the first coupling means, to thereby produce a fast-rising transition of an output signal in response to the fast-rising transition of the input signal;

(d) applying a fast-falling transition of the input signal to the bases of the PNP and NPN input transistors, thereby increasing a $V_{BE}$ voltage of the PNP input transistor and increasing a collector current thereof, and decreasing a $V_{BE}$ voltage of the NPN input transistor and decreasing a collector current thereof;

(e) causing the collector current of the PNP input transistor to flow through a control transistor of a second current mirror, thereby increasing an output current thereof, the second current mirror having a DC gain in the range of approximately 0.70 to 1.00;

(f) causing the output current of the second current mirror to discharge a parasitic capacitance associated with the second coupling means to thereby produce a fast-falling transition of the output signal in response to the fast-falling transition of the input signal;

(g) establishing a first bias current in the control transistor of the first current mirror by coupling a first constant current source to the control transistor of the first current mirror and causing the first bias current to flow in the (h) establishing a second bias current to flow in the control transistor of the second current mirror by coupling a second constant current source to the control transistor of the second current mirror and causing the second bias current to flow in the second constant current source; and (i) compensating the input offset voltage of the unity gain circuit by connecting a first NPN transistor and first PNP transistor between the emitter of the PNP input transistor and the base of the NPN output transistor to produce an NPN $V_{BE}$ voltage rise and a PNP $V_{BE}$ voltage drop in a path between the emitter of the PNP input transistor and the base of the NPN output transistor, and also connecting a second PNP transistor and a second NPN transistor between the emitter of the NPN input transistor and the base of the PNP output transistor to produce a PNP $V_{BE}$ voltage drop and an NPN $V_{BE}$ voltage rise in a path between the emitter of the NPN input transistor and the base of the PNP output transistor.

15. A method of improving slew rate and bandwidth of a unity gain amplifier including a PNP input transistor, an NPN input transistor, a PNP output transistor, and an NPN output transistor, first coupling means for coupling an emitter of the PNP input transistor to a base of the NPN output transistor, and second coupling means for coupling an emitter of the NPN input transistor to a base of the PNP output transistor, the method comprising the steps of:
(a) applying a fast-rising transition of an input signal to bases of the PNP and NPN input transistors, reducing a $V_{BE}$ voltage of the PNP input transistor and reducing a collector current thereof, and simultaneoulsy increasing a $V_{BE}$ voltage of the NPN input transistor and increasing a collector current thereof;
(b) causing the collector current of the NPN input transistor to flow through a control transistor in a first current mirror, thereby increasing an output current of the first current mirror; the first current mirror having a current gain in the range of approximately 0.70 to 1:00;
(c) supplying a first portion of the output current of the first current mirror directly into a first parasitic capacitance associated with the first coupling means, to rapidly charge the first parasitic capacitance and thereby produce a fast-rising transition of an output signal in response to the fast-rising transition of the input signal and causing a second portion of the output current of the first current mirror to flow through a first diode and a second diode;
(d) applying a fast-falling transition of the input signal to the bases of the PNP and NPN input transistors, thereby increasing a $V_{BE}$ voltage of the PNP input transistor and increasing a collector current thereof, and decreasing a $V_{BE}$ voltage of the NPN input transistor and decreasing a collector current thereof;
(e) causing the collector current of the PNP input transistor to flow through a control transistor of a second current mirror, thereby increasing an output current thereof, the second current mirror having a current gain in the range of approximately 0.70 to 1.00; and
(f) sinking a first portion of the output current of the second current mirror directly out of a second parasitic capacitance associated with the second coupling means to rapidly discharge the second parasitic capacitance and thereby produce a fast-falling transition of the output signal in response to the fast-falling transition of the input signal, and causing a second portion of the output current of the second current mirror to flow through the first and second diodes to bias the PNP output transistor and the NPN output transistor, the gains of the first and second current mirrors having values that result in critically damped high frequency response of the unity gain amplifier in response to high speed transitions of the input signal.

16. An operational transconductance amplifier, comprising in combination:
unity gain amplifier including
(1) a PNP input transistor, an NPN input transistor, a PNP output transistor, and an NPN output transistor, each having an emitter, a base, and a collector, the bases of the PNP input transistor and the NPN input transistor receiving an input signal, the NPN output transistor and the PNP output transistor being coupled to a first output conductor to produce an output signal;
(2) first means for coupling the emitter of the PNP input transistor to the base of the NPN output transistor;
(3) second means for coupling the emitter of the NPN input transistor to the base of the PNP output transistor;
(4) first current mirror means, including a first control transistor coupled to the collector of the NPN input transistor, for supplying increased current directly into a first parasitic capacitance associated with the first coupling means in response to a positive-going transition of the input signal, the first current mirror means having a current gain in the range of approximately 0.70 to 1.00;
(5) second current mirror means, including a second control transistor coupled to the collector of the PNP input transistor, for sinking increased current directly from a second parasitic capacitance associated with the second coupling means in response to a negative-going transition of the input signal, the second current mirror means having a current gain in the range of approximately 0.70 to 1.00;
(6) first and second diodes coupled in series between the bases of the NPN output transistor and the PNP output transistor, current flowing from the first current mirror means also flowing through the first and second diodes to the second current mirror means and biasing both the NPN output transistor and the PNP output transistor to an ON condition, the gains of the first and second current mirror means having values that result in damped high frequency response of the unity gain amplifier in response to high speed transitions of the input signal, wherein the NPN output transistor is an output transistor of a first Darlington circuit and the PNP output transistor is an output transistor of a second Darlington circuit, an NPN Darlington driver transistor in the first means having a base coupled to the emitter of the PNP input transistor and having an emitter connected to the base of the NPN output transistor, and a PNP Darlington driver transistor in the second means having a base coupled to the emitter of the NPN input transistor and an emitter connected to the base of the PNP output transistor;
(b) a third current mirror means, including a third control transistor coupled to the collector of the NPN output transistor, for supplying an output current mirrored from the collector of the NPN output transistor to a second output conductor;
(c) a fourth current mirror means, including a fourth control transistor coupled to the collector of the PNP output transistor, for supplying an output current mirrored from the collector of the PNP output transistor to the second output conductor.

* * * * *